June 24, 1969 S. KRONGELB 3,451,864

METHOD OF GROWING DOPED SEMICONDUCTOR MATERIAL FROM A SOURCE WHICH INCLUDES AN UNSTABLE ISOTOPE WHICH DECAYS TO A DOPANT ELEMENT

Filed Dec. 6, 1965

INVENTOR.
SOL KRONGELB
BY Bernard N. Wiener
ATTORNEY 3,451,864

METHOD OF GROWING DOPED SEMICONDUCTOR MATERIAL FROM A SOURCE WHICH INCLUDES AN UNSTABLE ISOTOPE WHICH DECAYS TO A DOPANT ELEMENT

Sol Krongelb, Somers, N.Y., assignor to International Business Machines Corporation, Armonk, N.Y., a corporation of New York Filed Dec. 6, 1965, Ser. No. 511,641
Int. Cl. H01l 7/34, 7/36
U.S. Cl. 148—1.5 13 Claims This invention relates to a method for doping semiconductor crystals and the doped crystals provided thereby, and it relates more particularly to doped semiconductor crystals having controlled amounts of dopants therein and a method for providing them.

A doped semiconductor crystal is provided by doping a semiconductor crystal with a concentration of an impurity atom which may be either a donor or an acceptor. If the dopant is a donor, current is carried in the crystal by electron flow and the semiconductor is characterized as n-type. If the dopant is an acceptor, current is carried in the crystal by flow of holes and the semiconductor is characterized as p-type.

A dopant impurity established in a semiconductor crystal lattice bonds covalently with adjacent atoms of the basic constituents of the crystal in a manner that provides either a positive or a negative charge carrier. Illustratively, a gallium atom with three valence electrons established in the diamond lattice of a germanium crystal forms electron-pair bonds to three of the adjacent germanium atoms. As it does not provide for the bonding requirements of the other germanium atom, there is an electron deficiency or hole which can function as a charge carrier. Therefore, gallium is an acceptor dopant impurity for germanium. Similarly, a phosphorus atom with five valence electrons establishes a negative charge carrier in a germanium crystal lattice. Therefore, phosphorus is a donor dopant impurity for germanium.

There are many uses for a doped semiconductor crystal when used as a semiconductor device. Further, conconcentration and geometry, i.e., a specified number of dopant atoms in a particular region of the semiconductor. Several physical properties, e.g., optical response and current flow, are highly sensitive to the dopant concentration. In uses of a semiconductor crystal, the dopant concentration must be sufficiently controlled for there to be an operational circuit response by the semiconductor crystal when used as a semiconductor device. Further, cnoventionally doped semiconductor crystals often have detrimental growth configuraions resulting from the formation of the crystalline structure from constituents of different atomic or molecular species.

Heretofore, there have been several conventional techniques for obtaining doping concentrations in semiconductor crystals. Generally, they are unable to provide a semiconductor crystal with sufficiently controlled dopant centration. For example, in fabricating a p-type emitter growth techniques are usually impractical for producing high-quality, uniform crystals with extremely high doping levels. Further, known techniques require fabrication systems which are capable of handling both the basic semiconductor material and the dopant impurity.

Among the most important phenomena which inhibit or preclude sufficiently high dopant concentrations in a semiconductor crystal are segregation and reactivity.

The segregation phenomenon is manifested in that the solid crystal does not always contain the same dopant concentration as the liquid or vapor phase from which it is formed. In greater detail, segregation phenomena arise in the presence of two phases, e.g., solid phase and liquid phase. Illustratively, for crystal growth by epitaxy from a liquid phase there is the solid phase for the single crystal being grown and a molten phase in the melt. A dopant is added to the melt so that it will appear in the crystalline phase. However, the proportion of dopant in the crystal is not the same as the proportion of dopant in the melt. For example, with 1% dopant in the melt, 0.01% dopant may be obtained in the crystal. Therefore, the dopant impurity preferentially remains in the melt, i.e., it segregates to the melt and the crystal contains a smaller proportion of the dopant. Conversely, with some materials the dopant segregates into the solid phase and the growing crystal contains a relatively greater proportion of the dopant than the melt.

The phenomenon of reactivity can inhibit or preclude satisfactory crystal growth because the dopant is a different constituent than the major constituents of the semiconductor crystalline lattice. Their different chemical reactivities complicate the handling and concentration control of the constituents. The difficulties attendant fabrication techniques utilizing dopants different than the major lattice constituents have made it difficult to obtain sufficiently regular semiconductor crysal lattices; large enough crystal structures; and sufficiently high dopant concentration. For example, in fabricating a p-type emitter region on an n-type base region of germanium, it is desirable to dope the emitter region with gallium in a concentration of greater than $10^{19}$ atoms per cubic centimeter. However, because of segregation and reactivity phenomena, a gallium concentration above $10^{17}$ atoms per cubic centimeter is extremely difficult to obtain with an important crystal-growing technique termed vapor epitaxy at a desirable low temperature.

The term epitaxy" connotes a continuity of the lattice structure of a crystalline substrate during crystal growth. "Vapor epitaxy" refers to processes wherein there is transport of the lattice constituents in vapor form to the surface of a monocrystalline substrate.

Both a disproportionation reaction and pyrolytic decomposition are especially suitable fabrication processes for obtaining vapor epitaxial growth of a semiconductor crystal for the practice of this invention. In vapor epitaxy via a disproportionation reaction, a semiconductor constituent forms a compound with a carrier element at a particular temperature in one region of the fabrication system and is released from the carrier element at another temperature in the vicinity of the monocrystalline substrate upon which the semiconductor crystal is grown. In vapor epitaxy via pyrolytic decomposition, a compound having the semiconductor as one constituent is decomposed through absorbed heat in the vicinity of a substrate, and the constituents of the lattice grow epitaxially on the substrate.

It is an object of the present invention to provide a method for fabricating high-quality semiconductor crystals having high and controlled dopant concentration.

It is another object to provide a method for fabricating high-quality semiconductor crystals with simple fabrication systems.

It is still another object of this invention to provide a method for developing a doped semiconductor crystal from a semiconductor material and an unstable material which transforms into a dopant.

It is a further object of this invention to provide a method for fabricating a doped semiconductor crystal from a semiconductor material and an unstable isotope of a major lattice constituent of the material which decays into a suitable dopant.

Broadly, this invention provides crystal structures and method therefor. Unstable atoms are included in the crystalline lattice during its growth which thereafter decay to a different lattice constituent to obtain a predetermined dopant concentraion and geometry, i.e., dopant distribution, in the lattice. In the practice of this invention an isotope of one constituent of a semiconductor lattice is established therein during the crystal growth and thereafter it decays to another desired constituent which is maintained on the lattice site as a dopant impurity.

In a preferred embodiment of the invention, atoms of both stable and unstable germanium isotopes are formed into a semiconductor crystal. Subsequently, the unstable germanium isotope decays into gallium to produce a gallium-doped germanium semiconductor crystal of p-type conductivity. Although the fabrication system need be capable of handling only germanium, the resulting crystal is doped with gallium upon the decay of the isotope of germanium. Furthermore, the crystal can be doped to an extremely high level, and a uniform, high-quality crystal can be readily fabricated even though the dopant exceeds its normal solubility in the lattice.

The invention can be practiced with many elementary and compound semiconductor materials, and the isotope need not be of the same material as the semiconductor material. For suitable doping it is only required that the isotope ultimately give rise to an atomic specie which is a proper lattice constituent of the desired semiconductor crystal.

A previous proposal to obtain transmutation doped p-type germanium by neutron bombardment of a germanium crystal has several drawbacks. The entire semiconductor crystal must generally be bombarded thus making it difficult if not impossible to provide small device structures. Several transmutations are induced thus making doping control difficult unless the semiconductor lattice constituents are proper isotopes. For compound semiconductors at least two constituent species must be present, which increases the number of possible transmutations and decay products in the crystal lattice making it difficult to obtain a predetermined dopant concentration. Undesirable lattice damage generally occurs through neutron bombardment of a crystal lattice.

It is an advantage of the practice of this invention that during incorporation in a semiconductor of the material which is to be the dopant, the material can be the same chemical specie as a major lattice constituent. Therefore, chemistry can be simplified to the handling of a single specie. Further, for compound semiconductors, e.g., GaAs, at least two chemical species must be handled, and since it is quite difficult to handle controllably the dopant as a third specie, the practice of this invention is advantageous.

It is another advantage of the practice of this invention that solubility of a dopant in the semiconductor crystal lattice is not limited by saturation since the dopant initially enters the lattice as an unstable isotope of a major lattice constituent and is quenched in place.

It is still another advantage of the practice of this invention that with low energy decay schemes, e.g., $$Ge^{71} \rightarrow Ga^{71}$$

the dopant atom normally remains in the same lattice position as its parent atom and there is no lattice damage which requires temperature annealing.

It is a further advantage of the practice of this invention that the difficulty of attaining a high dopant level in a semiconductor crystal during vapor epitaxial growth is obviated. With present technology, high doping levels are generally achieved only in high temperature deposition systems. However, by the practice of this invention it is possible to achieve high doping, e.g., $10^{19}$ to $10^{20}$ atoms per cubic centimeter, regardless of the system temperature.

The foregoing and other objects, features and advantages of the invention will be apparent from the following more particular description of a preferred embodiment of the invention, as illustrated in the accompanying drawings.

Practice of the invention will now be explained through consideration of the figures.

Figure 1:
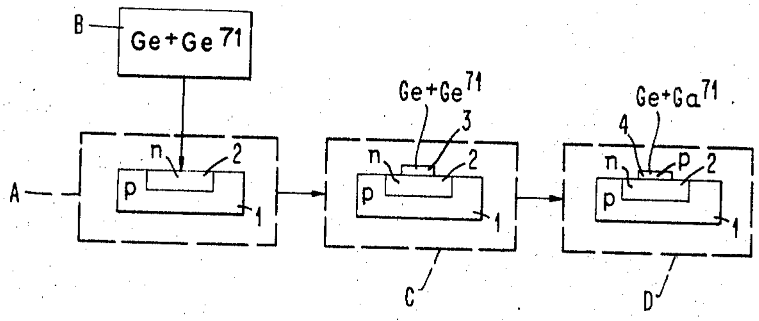
FIGURE 1 is a block diagram illustrating the technique of this invention.

FIG. 1 is a block diagram illustrating the technique of this invention as applied for doping a germanium crystal with gallium to obtain an emitter junction. A semiconductor crystal is shown in block A having a p-type collector region 1 and an n-type base region 2. Through the practice of this invention a p-type emitter region is to be provided. Block B represents a source of germanium in natural abundance with a quantity of $Ge^{71}$ having half-life of 11 days included therewith. Block C represents a region 3 comprising $Ge+Ge^{71}$ epitaxially grown on the n-type region 2 which has been suitably masked therefor. Finally, after elapse of a proper time interval to permit a sufficient amount of decay of $$Ge^{71} \rightarrow Ga^{71}$$

there is provided in block D a p-type region 4 from region 3 in which germanium is doped with gallium.

Figure 2:
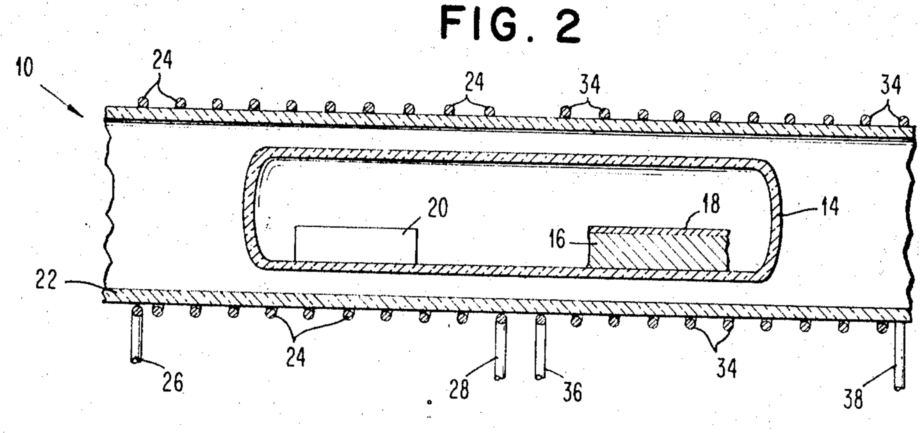
FIGURE 2 is a schematic diagram of a fabrication system that is used in practice of a preferred embodiment of the invention.
Figure 3:
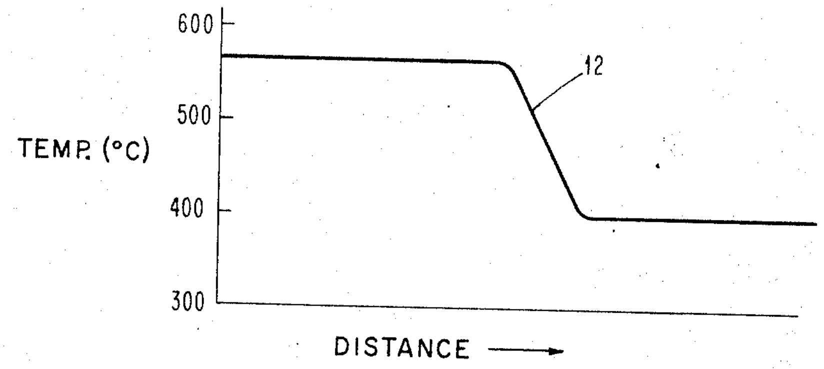
FIGURE 3 is a temperature vs. distance profile correlated with the fabrication system of FIGURE 2.

FIG. 2 is a schematic diagram of a closed tube system 10 useful for growing single crystal germanium by vapor epitaxy through a disproportionation reaction; and FIG. 3 is a line diagram showing a temperature vs. distance profile 12 correlated with the length of reaction tube 14 within which the vapor epitaxy of germanium in FIG. 2 is carried out. Illustratively, the semiconductor crystal layer 18 being fabricated is germanium (Ge) and the desired dopant is gallium (Ga). The main lattice constituent of the semiconductor crystal is Ge in its natural isotopic abundance and the dopant is obtained via the decay of $Ge^{71}$ to $Ga^{71}$. For convenience of exposition, the nature of seed substrate 16 is not defined in detail. It will be understood that it may be an n-type region such as region 2 of FIG. 1.

The desired concentration of gallium dopant for p-type layer 18 on seed crystal 16 is determined by conventional calculation. A source 12 is fabricated having a proportion of $Ge^{71}$ to naturally occurring Ge the same as the required dopant gallium to the lattice germanium.

Illustrative background material concerning epitaxial growth of semiconductor crystals and the disproportionation reaction utilized in the system of FIG. 1 are: U.S. Patent No. 3,047,438 for Epitaxial Semiconductor Deposition and Apparatus by J. P. Marinace, filed May 28, 1959 and issued July 31, 1962, and assigned to the assignee hereof; and the article "Epitaxial Vapor Growth of Germanium Single Crystals in a Closed Cycle Process," IBM Journal of Research and Development, vol. 4, July 1960, pp. 248–255.

The source 20 having Ge in its natural abundance and unstable $Ge^{71}$ is established at the left end of evacuated tube 14, and the Ge seed substrate 16 is established at the other end. A source of pure $I_2$ (not shown) is established in the evacuated tube near the source 20, and during the heating process described below, vapor of $GeI_2$ and $GeI_4$ is obtained through vaporization of the $I_2$ and its reaction with the germanium in tube 14. The tube 14 is positioned within a furnace tube 22 having windings 24 and 34 wound thereon. By energizing windings 24 and 34 via terminal pair 26 and 28 and terminal pair 36 and 38, respectively, a temperature gradient is provided in tube 14 as shown in the temperature-distance diagram of FIG. 3 correlated to the respective position along the length. The deposition of the epitaxial germanium layer 18 on the seed 16 occurs according to the disproportionation reaction $$2GeI_2 \rightleftarrows GeI_4 + Ge$$

The reaction proceeds towards the left as the temperature increases and proceeds towards the right as the temperature decreases. Accordingly, the germanium source 20 is held at a higher temperature than is the seed substrate 16 so that vapor epitaxial growth of layer 18 occurs. The seed substrate 16 is normally kept as cool as possible without permitting $GeI_2$ to condense thereon. For a low $I_2$ concentration, the temperature of the seed substrate 16 may be lower than shown in FIG. 3.

The practice of this invention has been described mainly with an example of doping a germanium crystal with a germanium isotope which decays to a stable isotope of the dopant gallium. Numerous examples of proper isotopes for doping many semiconductor crystals are available. An illustrative book which provides useful data on the natural abundance of each elment and the known unstable isotopes is Handbook of Chemistry and Physics, published by Chemical Rubber Publishing Co., which is issued in an up-dated edition periodically. The data herein on unstable isotopes is from the Fortieth Edition, 1958–1959.

In the field of semiconductors, this invention can be practiced with compounds, of which the following III–V compounds are exemplary illustrations. Sulfur may be incorporated as an n-type dopant in GaP and in InP via $P^{32}$ which decays with a 14.3 day half-life to $S^{32}$. Selenium may be incorporated as an n-type dopant into GaAs via $As^{76}$ which decays with a half-life of 26.5 hours to $Se^{76}$. Cadmium may be incorporated as a p-type dopant in InSb and in InP via $In^{111}$ which decays with a half-life of 2.81 days to $Cd^{111}$.

The following are useful criteria for selecting isotopes for the practice of this invention:

(a) The isotope should be initially capable of being a semiconductor lattice constitutent, e.g., an isotope of a major semiconductor constituent is satisfactory since it is atomically the semiconductor constituent itself.

(b) The final decay product should be the desired dopant and should be stable.

(c) The half-life should be long enough to permit the time required to fabricate the doped semiconductor. Illustratively, an epitaxial growth technique which takes several hours to complete requires a half-life for the unstable isotope which is considerably longer. The half-life should be short enough so that decay is essentially complete in a practical time interval. For example, in a time interval of four elapsed half-lives, 92.4% of the ultimate dopant level has been achieved. Thus, isotopes with half-lives of years are generally excluded for practical reasons for the practice of this invention when semiconductor crystals are desired for early operational use.

(d) The isotope need not be the same element as a major constituent of the semiconductor lattice, e.g., if the object is to exceed the natural solubility of Sb in Ge, $Sn^{123}$ can be alloyed into Ge. Sn is very soluble in Ge and large amounts go into lattice positions. $Sn^{123}$ then decays to $Sb^{123}$. Although the half-life of $Sn^{123}$ is 40 minutes, it is suitable for practical purposes.

(e) The decay scheme should be of sufficiently low energy and should preferably yield such decay products as do not damage the semiconductor lattice. Otherwise, temperature annealing may be necessary.

Operational requirements are determinative of the unstable isotopes which may be desirably used for the practice of this invention illustratively, if the half-life is quite short, then the fabrication of the semiconductor crystal must be performed quite rapidly. The half-life should not be so long as to preclude use of the semiconductor crystal in a device for a prescribed purpose.

Many semiconductor devices are available through the practice of this invention which were never before achievable. Illustratively, a semiconductor device can be fabricated by this invention whose semiconductor properties for a circuit application is ascertained to become operational at a predetermined prescribed time or for a predetermined interval. Two parameters of the isotope selected for the dopant impurity are its number of atoms and half-life. They permit identification of the elapsed time at which the required semiconductor property is obtained.

It will be apparent that the practice of this invention also includes using an unstable dopant isotope which decays suitably to the main semiconductor lattice constituent to obtain a doped semiconductor whose transient operational characteristics are predetermined over a time interval. It will also be understood that semiconductor devices can be provided whose dopant concentration changes during operational circuit response.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. Method of growing a doped semiconductor material comprising the steps of:

establishing a source of semiconductor material selected from the group consisting of elemental and compound semiconductors;

including in said source an unstable isotope which decays to a dopant element after semiconductor material growth; and growing said doped semiconductor material.

2. Method according to claim 1 wherein said unstable isotope is initially capable of being a lattice constituent of said semiconductor material.

3. Method according to claim 1 wherein said semiconductor material is deposited as a layer on a substrate.

4. Method according to claim 3 wherein said layer is epitaxially deposited and said substrate is monocrystalline.

5. Method according to claim 4 wherein said semiconductor material and said unstable isotope have the same atomic number.

6. Method according to claim 4 wherein said semiconductor material is germanium and said unstable isotope is $Ge^{71}$.

7. Method according to claim 4 wherein said semiconductor material includes the constituents of a compound semiconductor and said unstable isotope includes an unstable isotope of one said constitutent of said compound semiconductor.

8. Method according to claim 7 in which said compound semiconductor is a III–V semiconductor.

9. Method according to claim 8 wherein said compound semiconductor is GaP and said unstable isotope is $P^{32}$.

10. Method according to claim 8 wherein said compound semiconductor is InP and said unstable isotope is $P^{32}$.

11. Method according to claim 8 wherein said compound semiconductor is GaAs and said unstable isotope is $As^{76}$.

12. Method according to claim 8 wherein said compound semiconductor is InSb and said unstable isotope is $In^{111}$.

13. Method according to claim 8 wherein said compound semiconductor is InP and said unstable isotope is $In^{111}$.

References Cited

UNITED STATES PATENTS

| | | | |
|---|---|---|---|
| 2,994,628 | 8/1961 | Paskell | 148—1.5 |
| 2,995,473 | 8/1961 | Levi | 148—1.5 |
| 3,076,732 | 2/1963 | Tanenbaum | 148—1.5 |
| 3,255,050 | 6/1966 | Klahr | 148—1.5 |

OTHER REFERENCES

Fritzsche, H., et al., Physical Review, vol. 119, 1960, pp. 1238–1245.

L. DEWAYNE RUTLEDGE, *Primary Examiner.*

PAUL WEINSTEIN, *Assistant Examiner.*

U.S. Cl. X.R.

29—576; 117—106, 201; 148—171, 174, 175; 252—62.3; 317—234